US011469763B1

(12) United States Patent
Tu et al.

(10) Patent No.: US 11,469,763 B1
(45) Date of Patent: Oct. 11, 2022

(54) LOW-PASS FILTERING SYSTEM HAVING PHASE-LOCKED LOOP

(71) Applicant: RAYINN TECHNOLOGY, INC., Zhudong Township, Hsinchu County (TW)

(72) Inventors: Shih-Hai Tu, Hsinchu (TW); Ming-Fa Tsai, Hsinchu (TW)

(73) Assignee: RAYINN TECHNOLOGY, INC., Zhudong Township (TW)

( * ) Notice: Subject to any disclaimer, the term of this patent is extended or adjusted under 35 U.S.C. 154(b) by 0 days.

(21) Appl. No.: 17/558,131

(22) Filed: Dec. 21, 2021

(30) Foreign Application Priority Data

Nov. 16, 2021 (TW) .................. 110142501

(51) Int. Cl.
*H03L 7/085* (2006.01)
*H03L 7/093* (2006.01)
*H03L 7/107* (2006.01)
(52) U.S. Cl.
CPC .............. *H03L 7/085* (2013.01); *H03L 7/093* (2013.01); *H03L 7/107* (2013.01)

(58) Field of Classification Search
CPC .......... H03L 7/085; H03L 7/093; H03L 7/107
See application file for complete search history.

(56) References Cited

U.S. PATENT DOCUMENTS 11,349,310 B2 * 5/2022 Torabi ...................... H02J 3/18

FOREIGN PATENT DOCUMENTS

CN 101820281 A * 9/2010
CN 114400703 A * 4/2022

* cited by examiner

*Primary Examiner* — Patrick O'Neill
(74) *Attorney, Agent, or Firm* — Maschoff Brennan

(57) ABSTRACT

Disclosed is a low-pass filtering system having a phase-lock loop comprising a Park transform circuit, a first low-pass filter, a second low-pass filter, an inverse Park transform circuit, a phase-locked loop filter, and a voltage-controlled oscillator. The Park transform circuit, the first low-pass filter, the second low-pass filter, and the inverse Park transform circuit form a phase detector of a phase-locked loop, since the low-pass filter system of the present invention has the phase-locked loop mechanism, the phase and amplitude of a output signal remain the same with those of the original AC input signal.

3 Claims, 3 Drawing Sheets

LOW-PASS FILTERING SYSTEM HAVING PHASE-LOCKED LOOP

FIELD OF THE INVENTION

The present invention relates to a low-pass filter, and more particularly relates to a low-pass filtering system having a phase-locked loop.

BACKGROUND OF THE INVENTION

A typical low-pass filter has a function of filtering out a high-frequency noise from an AC input signal and retaining the original frequency components of the AC input signal. However, after the AC input signal is filtered by the low-pass filter, a phase of its output signal would fall behind the phase of the original AC input signal, and amplitude of the output signal is also attenuated compared to amplitude of the original AC input signal. This will cause a loss for the acquisition of an AC input signal.

SUMMARY OF THE INVENTION

Accordingly, one objective of the present invention is to provide a low-pass filtering system having a phase-locked loop, which can avoid the phase lag of the output signal and suppress the amplitude attenuation of the signal.

In order to overcome the technical problems in prior art, the present invention provides an low-pass filtering system having a phase-locked loop, comprising: a Park transform circuit, which receives an external AC input signal, and transforms the AC input signal into a d-axis component signal and a q-axis component signal by Park transformation; a first low-pass filter, which is connected to the Park transform circuit, the first low-pass filter being provided to perform low-pass filtering on the d-axis component signal; a second low-pass filter, which is connected to the Park transform circuit, the second low-pass filter being provided to perform low-pass filtering on the q-axis component signal; an inverse Park transform circuit, which is connected to the first low-pass filter and the second low-pass filter, the inverse Park transform circuit being provided to transform the low-pass filtered d-axis component signal and the low-pass filtered q-axis component signal into an output signal by inverse Park transformation; a phase-locked loop filter, which is connected to the Park transform circuit, the phase-locked loop filter being provided to perform low-pass filtering on the q-axis component signal; and a voltage-controlled oscillator, which is connected to the phase-locked loop filter, the Park transform circuit and the inverse Park transform circuit, the voltage-controlled oscillator being provided to receive the q-axis component signal filtered by the phase-locked loop filter and generate a phase angle signal, the generated phase angle signal is sent back to the Park transform circuit and the inverse Park transform circuit such that a phase angle of a dq-reference frame is controlled by the Park transform circuit and the inverse Park transform circuit in response to the phase angle signal, wherein the Park transform circuit, the first low-pass filter, the second low-pass filter and the inverse Park transform circuit form a phase detector of the phase-locked loop.

In one embodiment of the present invention, the low-pass filtering system is provided, wherein the phase-locked loop filter is a proportional integral controller.

In one embodiment of the present invention, the low-pass filtering system is provided, wherein a β-input end of the Park transform circuit is connected to a β-output end of the inverse Park transform circuit.

By the technical means adopted by the present invention, the Park transform circuit transforms the AC input signal into the d-axis component signal and the q-axis component signal by Park transformation. The magnitude of the q-axis component signal is related to a phase angle difference between the AC input signal and the dq-reference frame, so that the Park transform circuit, the first low-pass filter, the second low-pass filter and the inverse Park transform circuit are provided to form a phase detector of a phase-locked loop. By combining the phase detector with the phase-locked loop filter and the voltage-controlled oscillator, the low-pass filtering system of the present invention has a phase-locked loop mechanism. Accordingly, when the low-pass filtering system of the present invention is in a steady state, the phase and amplitude of the output signal remain the same as those of the original AC input signal.

DETAILED DESCRIPTION OF THE PREFERRED EMBODIMENTS

The preferred embodiments of the present invention are described in detail below with reference to FIG. 1 to FIG. 5. The description is used for explaining the embodiments of the present invention only, but not for limiting the scope of the claims.

Figure 1:
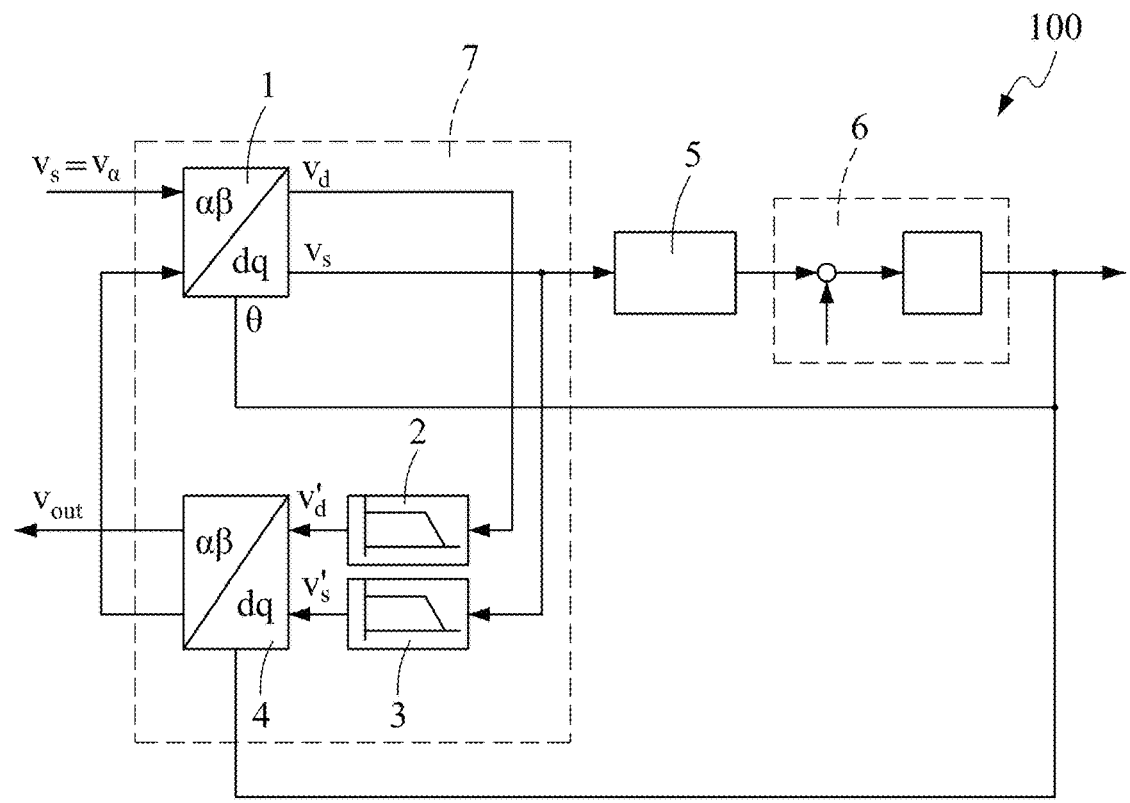
FIG. 1 is a block diagram illustrating a low-pass filtering system having a phase-locked loop according to one embodiment of the present invention.
Figure 3:
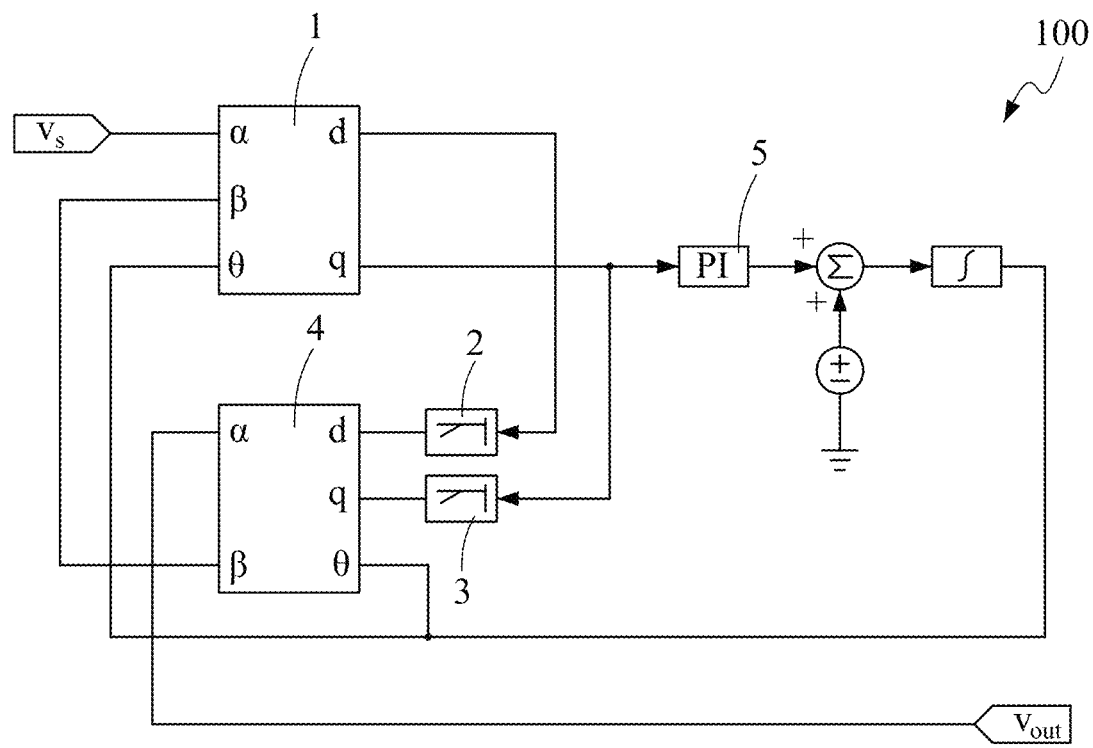
FIG. 3 is a circuit diagram illustrating the of the low-pass filtering system according to the embodiment of the present invention.

As shown in FIG. 1 and FIG. 3, a low-pass filtering system 100 having a phase-locked loop according to one embodiment of the present invention includes: a Park transformation circuit 1, a first low-pass filter 2, a second low-pass filter 3, an inverse Park transformation circuit 4, a phase-locked loop filter 5 and a voltage-controlled oscillator 6.

The Park transformation circuit 1, the first low-pass filter 2, the second low-pass filter 3 and the inverse Park transformation circuit 4 forms a phase detector 7 of the phase-locked loop. The phase detector 7 is connected to the phase-locked loop filter 5 and the voltage-controlled oscillator 6, so that the low-pass filtering system 100 has a phase-locked loop mechanism. Accordingly, when the low-pass filtering system 100 of the present invention is in a steady state, the phase and amplitude of the output signal $v_{out}$ remain the same as those of the original AC input signal $v_s$.

Figure 2:
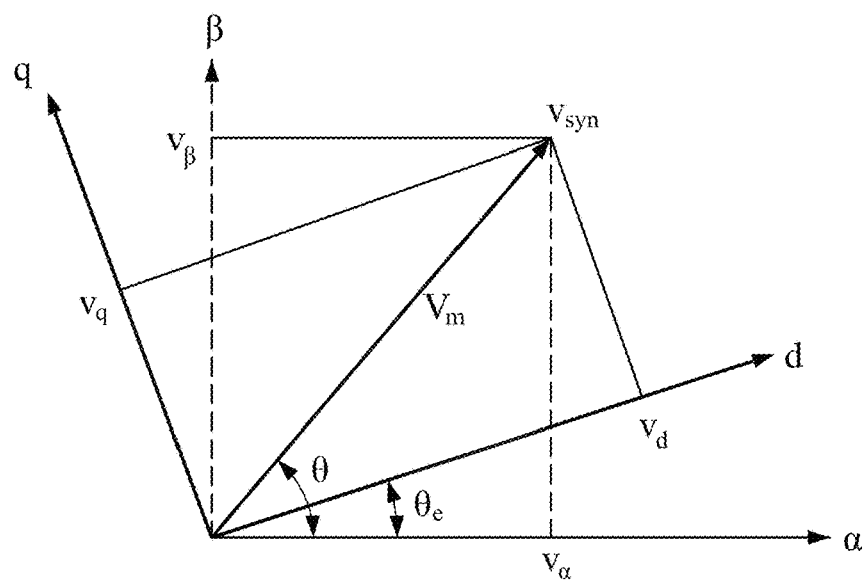
FIG. 2 is a diagram illustrating a relationship between a αβ-reference frame and a dq-reference frame.

In detail, the Park transform circuit 1 is a circuit that operates based on the principle of Park transformation. As shown in FIG. 2, an αβ-reference frame is a stationary reference frame. An AC signal $v_{syn}$ is indicated as a line segment rotating at an angular velocity ω in the αβ-reference frame. A peak value of the AC signal $v_{syn}$ is $V_m$, and a phase angle of the AC signal $v_{syn}$ is θ. The dq-reference frame is a reference frame that rotates synchronously with the AC signal $v_{syn}$. The angle between the dq-reference frame and the αβ-reference frame is $\theta_e$.

The components of the AC signal $v_{syn}$ on the α-axis and β-axis of the αβ-reference frame are indicated as the following mathematical formula (1):

$$\begin{bmatrix} v_\alpha \\ v_\beta \end{bmatrix} = V_m \begin{bmatrix} \cos\theta \\ \sin\theta \end{bmatrix} \quad (1)$$

The components of AC signal $v_{syn}$ on the d-axis and q-axis of the dq-reference frame are indicated as the following mathematical formula (2):

$$\begin{bmatrix} v_d \\ v_q \end{bmatrix} = \begin{bmatrix} \cos\theta_e & \sin\theta_e \\ -\sin\theta_e & \cos\theta_e \end{bmatrix} \begin{bmatrix} v_\alpha \\ v_\beta \end{bmatrix} \quad (2)$$

In the present embodiment, the Park transformation is performed in digital. The Park transform circuit 1 has an analog-to-digital convertor, so as to convert the AC input signal $v_s$ with high-frequency noise to a digital signal. As shown in FIG. 1 and FIG. 3, an α-input end of the Park transform circuit 1 receives an external AC input signal $v_s$, and then the AC input signal $v_s$ is transformed into a d-axis component signal $v_d$ and a q-axis component signal $v_q$ by Park transformation. The d-axis component signal $v_d$ and the q-axis component signal $v_q$ have high-frequency noise. The AC input signal $v_s$ is indicated as the following mathematical formula (3):

$$v_s = V_m \cos\omega t = V_m \cos\theta = v_\alpha \quad (3)$$

By substituting the mathematical formula (2) with the mathematical formula (1) and the mathematical formula (3), the following mathematical formulae can be obtained:

$$v_d = V_m \cos\theta \cos\theta_e + v_m \sin\theta \sin\theta_e = V_m \cos(\theta-\theta_e) \quad (4)$$

$$v_q = -V_m \cos\theta \sin\theta_e + v_m \sin\theta \cos\theta_e = V_m \sin(\theta-\theta_e) \quad (5)$$

If $\theta_e \approx \theta$ is given, the mathematical formula (4) and mathematical formula (5) can be rewritten as the following mathematical formulae:

$$v_d = V_m \quad (6)$$

$$v_q = V_m(\theta-\theta_e) \quad (7)$$

The magnitude of the q-axis component signal $v_q$ is related to a phase angle difference between the AC input signal and a dq-reference frame, so that the Park transform circuit 1, the first low-pass filter 2, the second low-pass filter 3, and the inverse Park transform circuit 4 form a phase detector 7 of the phase-locked loop. From the mathematical formula (7), when $\theta_e = \theta$, $v_q = 0$ can be obtained. In other words, the d-axis of the dq-reference frame is locked at the AC signal $v_{syn}$ at this moment.

As shown in FIG. 1 and FIG. 3, the first low-pass filter 2 is connected to a d-output end of the Park transform circuit 1. The first low-pass filter 2 performs low-pass filtering on the d-axis component signal $v_d$ to obtain $v'_d$.

As shown in FIG. 1 and FIG. 3, the second low-pass filter 3 is connected to a q-output end of the Park transform circuit 1. The second low-pass filter 3 performs low-pass filtering on the q-axis component signal $v_q$ to obtain $v'_q$.

As shown in FIG. 1 and FIG. 3, the inverse Park transform circuit 4 is a circuit that operates based on the principle of inverse Park transformation. A d-input end and a q-input end of the inverse Park transform circuit 4 are respectively connected to the first low-pass filter 2 and the second low-pass filter 3. The inverse Park transform circuit 4 transforms the low-pass filtered d-axis component signal $v'_d$ and the low-pass filtered q-axis component signal $v'_q$ into an output signal $v_{out} = v'_\alpha$ by inverse Park transformation. The output signal $v_{out}$ of the inverse Park transform circuit 4 is a filtered digital signal without a phase lag and attenuated amplitude. The digital signal also can be converted into an analog signal by a digital-to-analog convertor. A β-input end of the Park transform circuit is connected to a β-output end of the inverse Park transform circuit.

$$\begin{bmatrix} v'_\alpha \\ v'_\beta \end{bmatrix} = \begin{bmatrix} \cos\theta_e & -\sin\theta_e \\ \sin\theta_e & \cos\theta_e \end{bmatrix} \begin{bmatrix} v'_d \\ v'_q \end{bmatrix} \quad (7)$$

As shown in FIG. 1 and FIG. 3, the phase-locked loop filter 5 is connected to the q-output end of the Park transform circuit 1, the phase-locked loop filter 5 performs low-pass filtering on the q-axis component signal $v_q$. In this embodiment, the phase-locked loop filter 5 is a proportional integral controller (PI controller).

As shown in FIG. 1 and FIG. 3, the voltage-controlled oscillator 6 is connected to the phase-locked loop filter 5, the Park transform circuit 1 and the inverse Park transform circuit 4. And the voltage-controlled oscillator 6 receives the q-axis component signal $v_q$ filtered by the phase-locked loop filter 5 and generates a phase angle signal θ, the generated phase angle signal θ is sent back to a θ-input end of the Park transform circuit 1 and a θ-input end of the inverse Park transform circuit 4. The Park transform circuit 1 and the inverse Park transform circuit 4 control a phase angle $\theta_e$ of the dq-reference frame to approach the phase angle θ of the AC signal $v_{syn}$ according to the phase angle signal θ. By combining the phase detector 7 with the phase-locked loop filter 5 and the voltage-controlled oscillator 6, the low-pass filtering system 100 of the present invention has a phase-locked loop mechanism. Thereby, when the low-pass filtering system 100 of the present invention is in a steady state, the phase and amplitude of the output signal $v_{out}$ remain the same with those of the original AC input signal $v_s$.

Figure 4:
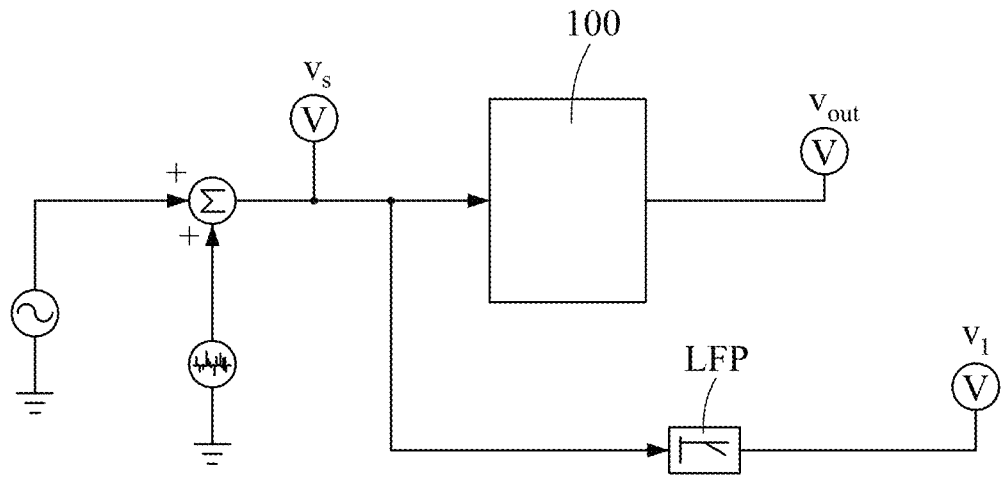
FIG. 4 is a circuit diagram illustrating the low-pass filtering system according to the embodiment of the present invention and a typical low-pass filter.
Figure 5:
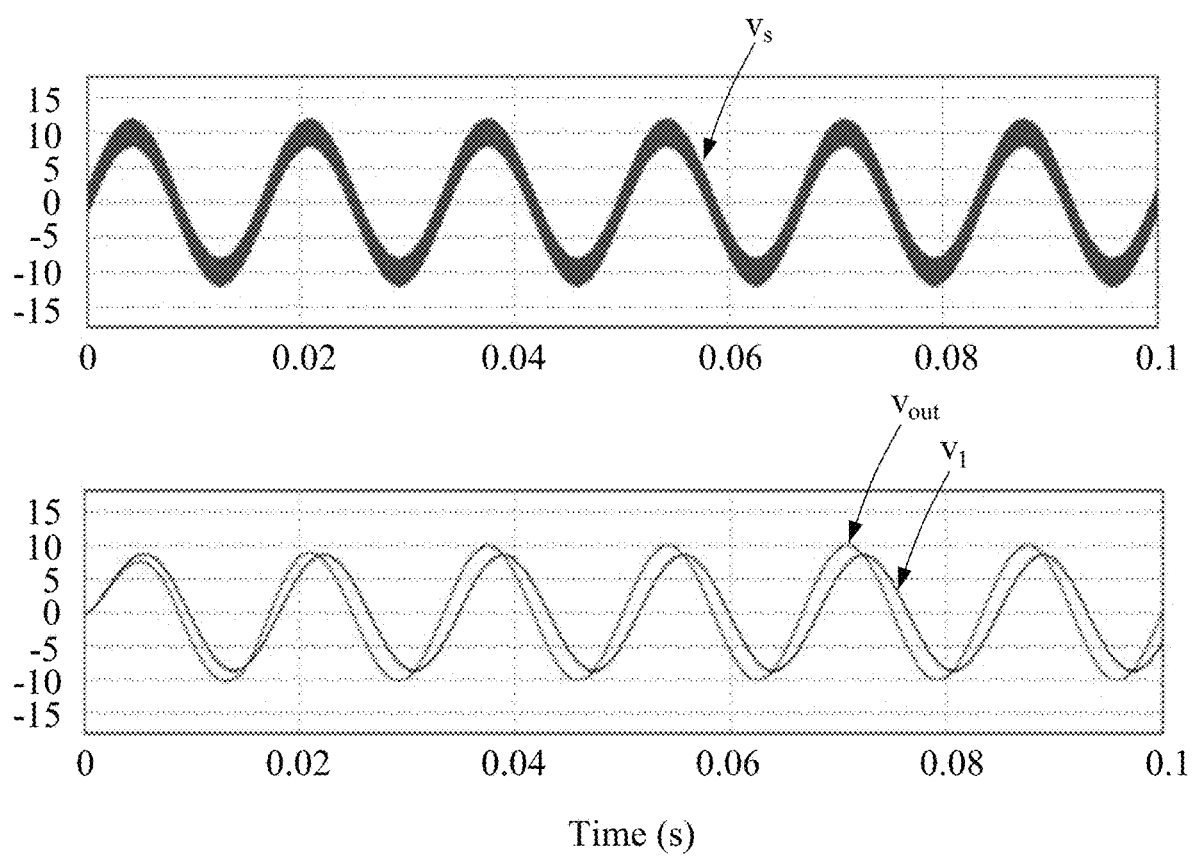
FIG. 5 is a simulated oscillogram illustrating a comparison between the low-pass filtering system according to the embodiment of the present invention and the typical low-pass filter.

As shown in FIG. 4 and FIG. 5, the low-pass filtering system 100 of the present invention and a low-pass filter LPF take a sine wave with noise as an AC input signal $v_s$. After a few cycles and reaching a steady state, a phase of an output signal $v_1$ of the low-pass filter LPF falls behind the phase of the original AC input signal $v_s$, and amplitude of the output signal $v_1$ is also attenuated compared to amplitude of the original AC input signal $v_s$. Compared with the original AC input signal $v_s$, the output signal $v_{out}$ of the low-pass filtering system 100 of the present invention has no phase lag and the amplitude attenuation of the signal is suppressed due to the phase-lock loop mechanism.

The above description should be considered as only the discussion of the preferred embodiments of the present invention. However, a person having ordinary skill in the art may make various modifications without deviating from the present invention. Those modifications still fall within the scope of the present invention.

What is claimed is:

1. A low-pass filtering system having a phase-locked loop, comprising:

a Park transform circuit, which receives an external AC input signal, and transforms the AC input signal into a d-axis component signal and a q-axis component signal by Park transformation;

a first low-pass filter, which is connected to the Park transform circuit, the first low-pass filter being provided to perform low-pass filtering on the d-axis component signal;

a second low-pass filter, which is connected to the Park transform circuit, the second low-pass filter being provided to perform low-pass filtering on the q-axis component signal;

an inverse Park transform circuit, which is connected to the first low-pass filter and the second low-pass filter, the inverse Park transform circuit being provided to transform the low-pass filtered d-axis component signal and the low-pass filtered q-axis component signal into an output signal by inverse Park transformation;

a phase-locked loop filter, which is connected to the Park transform circuit, the phase-locked loop filter being provided to perform low-pass filtering on the q-axis component signal; and a voltage-controlled oscillator, which is connected to the phase-locked loop filter, the Park transform circuit and the inverse Park transform circuit, the voltage-controlled oscillator being provided to receive the q-axis component signal filtered by the phase-locked loop filter and generate a phase angle signal, the generated phase angle signal is sent back to the Park transform circuit and the inverse Park transform circuit such that a phase angle of a dq-reference frame is controlled by the Park transform circuit and the inverse Park transform circuit in response to the phase angle signal, wherein the Park transform circuit, the first low-pass filter, the second low-pass filter and the inverse Park transform circuit form a phase detector of the phase-locked loop.

2. The low-pass filtering system of claim 1, wherein the phase-locked loop filter is a proportional integral controller.

3. The low-pass filtering system of claim 1, wherein a β-input end of the Park transform circuit is connected to a β-output end of the inverse Park transform circuit.

* * * * *